United States Patent
Shah et al.

(10) Patent No.: US 11,543,872 B2
(45) Date of Patent: Jan. 3, 2023

(54) DYNAMICALLY ADJUSTING DEVICE OPERATING VOLTAGE BASED ON DEVICE PERFORMANCE

(71) Applicant: Microsoft Technology Licensing, LLC, Redmond, WA (US)

(72) Inventors: Chirag Shah, San Jose, CA (US); Gregory A. Nielsen, Kirkland, WA (US); Seppo Juhani Jarvensivu, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 702 days.

(21) Appl. No.: 16/459,991

(22) Filed: Jul. 2, 2019

(65) Prior Publication Data

US 2021/0004073 A1    Jan. 7, 2021

(51) Int. Cl.
| | |
|---|---|
| *G06F 1/32* | (2019.01) |
| *G06F 1/3212* | (2019.01) |
| *G01R 31/392* | (2019.01) |
| *G01R 31/3835* | (2019.01) |
| *H02J 7/00* | (2006.01) |
| *G06N 20/00* | (2019.01) |

(52) U.S. Cl.
CPC ....... *G06F 1/3212* (2013.01); *G01R 31/3835* (2019.01); *G01R 31/392* (2019.01); *H02J 7/0047* (2013.01); *H02J 7/0063* (2013.01); *G06N 20/00* (2019.01); *H02J 2007/0067* (2013.01)

(58) Field of Classification Search
None
See application file for complete search history.

(56) References Cited

U.S. PATENT DOCUMENTS

| | | | |
|---|---|---|---|
| 6,981,179 B1 * | 12/2005 | Shigemasa | G01R 31/31926 714/36 |
| 8,671,170 B2 | 3/2014 | Frank et al. | |
| 9,122,483 B2 | 9/2015 | Guo et al. | |

(Continued)

FOREIGN PATENT DOCUMENTS

CN    104883806 A    9/2015

OTHER PUBLICATIONS

Rahman, et al., "Hydrothermal synthesis of nanostructured Co3O4 materials under pulsed magnetic field and with an aging technique, and their electrochemical performance as anode for lithium-ion battery", In Journal of Electrochimica Acta, vol. 55, Issue 2, Dec. 30, 2009, pp. 504-510.

(Continued)

*Primary Examiner* — Danny Chan
(74) *Attorney, Agent, or Firm* — Holzer Patel Drennan (57) ABSTRACT

The described technology provides a method for dynamically adjusting operating voltage of a device, including receiving device characteristics data related to a device, performing a margining test for the device to generate a performance curve characterizing variation of the device's current performance speeds at various operating voltages from expected performance speeds at the various operating voltages, determining an operating voltage for the device based on the device characteristics data and the performance curve, and adjusting the operating of the device based on the determined operating voltage.

17 Claims, 6 Drawing Sheets

(56) References Cited

U.S. PATENT DOCUMENTS

| | | |
|---|---|---|
| 9,323,320 B2 | 4/2016 | Fitzpatrick et al. |
| 10,218,200 B2 | 2/2019 | Sherstyuk et al. |
| 2009/0228727 A1 | 9/2009 | Tamura et al. |
| 2009/0289615 A1* | 11/2009 | Foley .................. G06F 1/3203 323/318 |
| 2010/0094572 A1* | 4/2010 | Chase .................. G06F 1/3203 702/57 |
| 2010/0188115 A1* | 7/2010 | Von Kaenel ....... H03K 19/0008 326/16 |
| 2011/0080202 A1* | 4/2011 | Moore .................. H03K 3/012 327/261 |
| 2011/0265090 A1* | 10/2011 | Moyer ................. G06F 1/3203 707/812 |
| 2013/0043914 A1 | 2/2013 | Gelman |
| 2013/0254569 A1* | 9/2013 | Kozaczuk .............. G06F 1/329 713/320 |
| 2014/0191734 A1* | 7/2014 | Kuang ..................... G05F 1/12 323/234 |
| 2016/0054784 A1* | 2/2016 | Decesaris ............. G06F 1/3234 713/320 |
| 2016/0329897 A1 | 11/2016 | Gu |
| 2017/0357311 A1 | 12/2017 | Hovis et al. |
| 2019/0033388 A1 | 1/2019 | Kamer et al. |

OTHER PUBLICATIONS

"International Search Report and Written Opinion Issued in PCT Application No. PCT/US20/031738", dated Jul. 17, 2020, 12 Pages.

\* cited by examiner

DYNAMICALLY ADJUSTING DEVICE OPERATING VOLTAGE BASED ON DEVICE PERFORMANCE

BACKGROUND

Computing devices, such as a cellular phone, a tablet, a laptop computer, use secondary or rechargeable batteries as energy sources. These batteries have charging and discharging curves that provide voltages as function of remaining capacity of the batteries as the batteries age. Operating the batteries using the discharge curves ensures that batteries are operated according to safety standards and that as the battery ages, its operation is altered to gain optimal performance. Moreover, the manner in which the voltage levels of the batteries are managed also affects the performance of the computing device components, including various processors, sensors, memory components, and other components using transistors.

This background information is provided for the purpose of making known information believed by the applicant to be of possible relevance to the invention. No admission is necessarily intended, nor should be construed, that any of the preceding information constitutes prior art against the invention.

SUMMARY

The described technology provides a method for dynamically adjusting operating voltage of a device, including receiving device characteristics data related to a device, performing a margining test for the device to generate a performance curve characterizing variation of the device's current performance speeds at various operating voltages from expected performance speeds at the various operating voltages, determining an operating voltage for the device based on the device characteristics data and the performance curve, and adjusting the operating of the device based on the determined operating voltage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTIONS

Circuitry used in computing systems may be made of a number of transistors connected by substrate level connectors with electrons passing between them. For example, devices may be made of a large number of transistors and configured to operate at high frequencies, typically in the gigahertz range. With the advances in technology, the size of the computing system devices continues to decrease and as the size of the devices decreases, the thickness of the connectors also decrease. For example, thickness of such connectors may be as small as 5-10 nanometers (nm). The degradation of these connectors over time results in more leakage of electrons as well in the degradation of gates. Therefore, as the devices age, higher operating voltages may be necessary to effectively operate the devices.

However, as the operating voltages of the devices are increased, it causes faster degradation of the performance of the circuitry (e.g., transistors). Also, higher operating voltages result in higher consumption of power and generation of higher temperature for the computing device, resulting in higher needs for cooling.

The technology described herein provides a method for dynamically adjusting operating voltage of a device to minimize the impact of such undesirable outcomes. Specifically, the described method dynamically adjusts operating voltage of a device based on device characteristics data related to a device and outcomes of a margining test for the device. In one implementation, the described method generates a performance curve characterizing variation of the device's current performance speeds at various operating voltages from expected performance speeds at the various operating voltages, and determines an operating voltage for the device based on the device characteristics data and the performance curve. Moreover, high utilization of the device components can cause them to age (degrade) more quickly and therefore it can be beneficial to track utilization rates and adjust operating voltages accordingly.

Moreover, as the battery used in the computing device ages, the performance of the battery declines. Such performance decline depends on cell chemistry of the battery and as the battery ages, the output cell voltage that the battery can support declines based on the battery's discharge curve. Therefore, it can also be beneficial to manage operating voltages provided by the battery to the device components in view of life of the device components as well as the life of the battery. Various implementations disclosed herein allows adjusting operating voltages provided by the battery to the device components in view of the battery performance characteristics.

Figure 1:
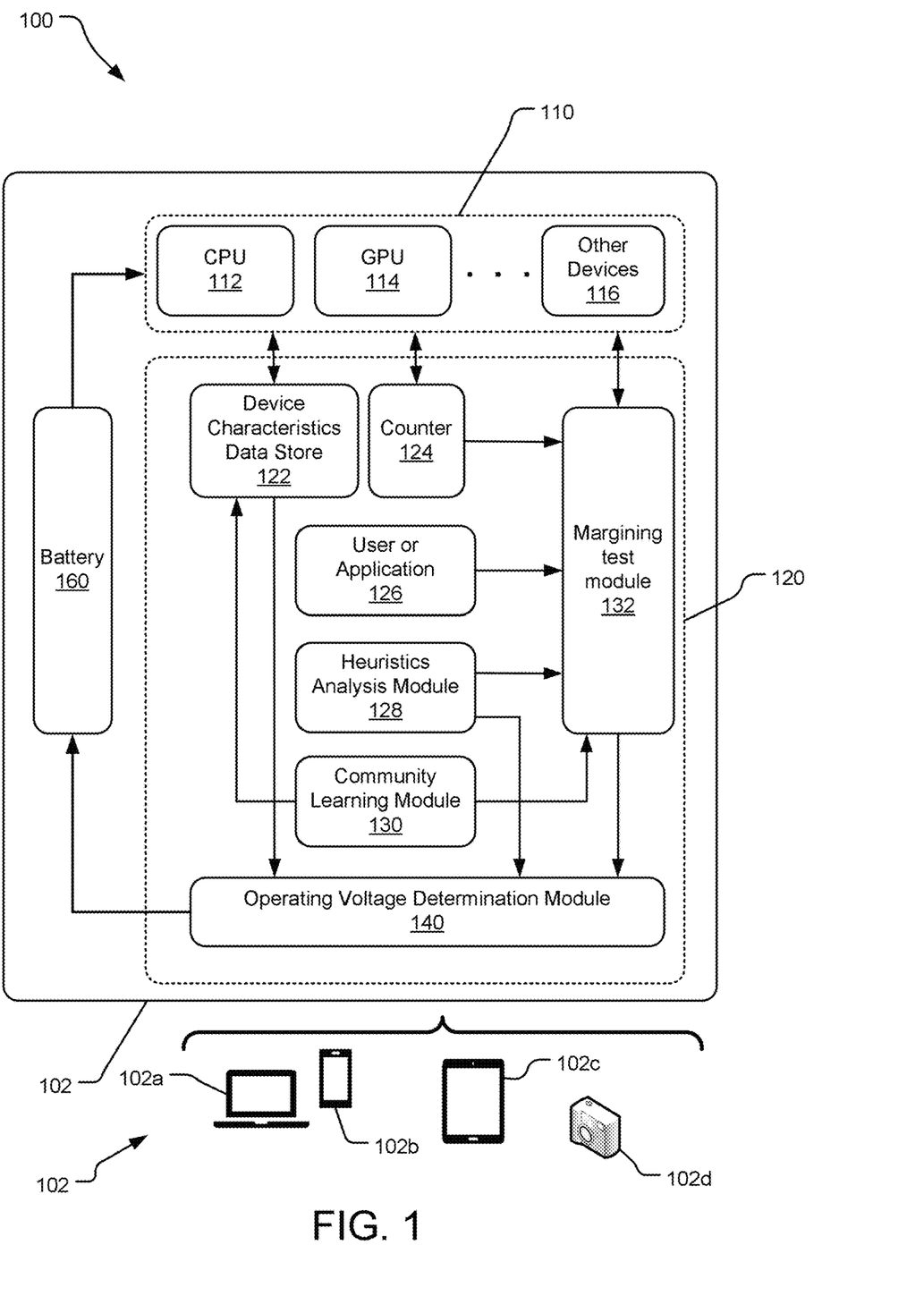
FIG. 1 illustrates an example system wherein the operating voltage of a device is dynamically adjusted as disclosed herein.

FIG. 1 illustrates a block diagram 100 of a computing system 102 wherein the operating voltage of a device is dynamically adjusted as disclosed herein. Specifically, the computing system 102 may be a computer 102a, a mobile device 102b, a tablet 102c, a camera 102d, or other device using a secondary battery and having one or more devices 110. The devices 110 include devices using transistors or other silicon based components. Example of such devices 110 include a central processing unit (CPU) 112, a graphical processing unit (GPU) 114, or other devices 116 such as a dual-core device, a multi-core device, and a sensor device. In one implementation, the devices 110 also include liquid crystal display (LCD) or other devices that require higher operating voltages as they age.

The devices 110 include a wide variety of devices including devices of different capabilities and speeds. The operating voltage of the devices 110 may be set based on their operating speed and other characteristics. For example, a manufacturer of the CPU 112 may provide suggested voltages for the CPU 112. In one implementation, the operating voltage of each of the devices 110 is set at different levels. Alternatively, all of the devices 110 are to be operated at the same speed.

The illustrated implementation of the computing system 102 includes a device operating voltage adjustment module 120 that is used to dynamically adjust the operating voltages of the devices 110 using device characteristics data from a device characteristics data store 122 and a margining test module 132. The device characteristics data store 122 may categorize the devices 110 based on their characteristics. For example, the manufacturer of the devices 110 may perform a series of testing on the bulk of devices to which the devices 110 belong to and provide characteristics of the devices 110 such as operating speeds at various operating voltages. In one implementation, such device characteristics data may be binning data that is provided in form of a table where each row provides a range of operating voltages and the expected operating speed of the device for that range of operating voltages. Thus, for example, the device characteristics data store 122 may provide that the CPU 112 being operated between 3.5 to 4.0 volts, its operating speed is 7 gigahertz, whereas if it is being operated between 4.0 to 4.5 volts, its operating speed is 7.25 gigahertz, etc.

In one implementation, the margining test module 132 performs margining tests on the devices 110 to generate a performance curve that characterizes the devices' 110 current performance speeds at various operating voltages. Thus, for example, a margining test on the CPU 112 may generate an output that provides a current graph of various operating voltages for the CPU 112 and its operating speed. Thus, the output of the margining test module 132 may specify that the CPU 112 when operated at 4.0 volts is capable of achieving an operating speed of 6.2 GHz, when operated at 4.5 volts is capable of achieving an operating speed of 6.9 GHz, etc. Note that the performance curve generated by the margining test module 132 differs from the combinations of operating voltages and performing speeds provided by the device characteristics data store 122.

An implementation of the margining test module 132 may be implemented in hardware using one or more circuits that operate the devices 110 at different operating voltage levels and store the resulting operating speed and throughput of the devices 110 in a memory. In another implementation, the margining test module 132 may be implemented in firmware with various registers used to initiate margining tests on the devices 110. Alternatively, the margining test module 132 is implemented by various instructions stored in a memory where these instructions are implemented using a computer processor.

In an alternative implementation, the margining test module 132 generates a differential performance curve that characterizes variation of the device's current performance speeds at various operating voltages from expected performance speeds at the various operating voltages. Such a differential performance curve may characterize performance degradation of the device at various voltage levels.

An operating voltage determination module 140 receives inputs from the device characteristics data store 122 and the margining test module 132 to determine operating voltage of the devices 110. For example, based on the performance curve for the CPU 112 as provided by the margining test module 132 and the device characteristics data for the CPU 112 as provided by the device characteristics data store 122, the operating voltage determination module 140 may determine that the CPU 112 is to be operated at 4.5 v.

In one implementation, the operating voltage determination module 140 operates the devices 110 based on the device characteristics data, such as the binning data provided by the manufacturer, during the initial stage in the life of the devices 110 and after a predetermined time period uses the performance curve generated by the margining test module. For example, for the first year of the life of the computing system 102, the operating voltages of the devices 110 are selected based on the device characteristics data from the device characteristics data store 122 and after a first year, the performance curve generated by the margining test module 132 is used to make such selection of operating voltages. In one implementation, such time period during which the initial device characteristics data is used is provided by the user of the computing system 102.

An implementation of the device operating voltage adjustment module 120 also includes various modules 124-130 that trigger the margining test module 132 to generate the current performance curve. For example, in one implementation, a counter 124 counts boot and sleep cycles for the devices 110 and when the count reaches a threshold, generates a trigger to the margining test module 132 to perform a margining test. In one implementation, a user may define the threshold that is used to generate the trigger. In an alternative implementation the counter 124 may track the usage of the devices 110 in an alternative manner, such as usage times of the devices 110 or usage clock ticks for the devices 110.

In alternative implementations, various applications running on the computing system 102 may be configured to monitor the performance of devices 110 and to indicate changes to the performance in comparison to a threshold performance level to an operating system of the computing system 102. For example, a gaming application running on the computing system 102 can track the responsiveness of the devices 110, compare the responsiveness to a threshold responsiveness, and alert the operating system when the responsiveness drops below the threshold responsiveness. In response, the operating system may initiate a margining test for the devices 110.

Alternatively, a user or an application 126 may generate a trigger to the margining test module 132 to perform a margining test. For example, in response to experiencing slower performance of the computing system 102, a user may initiate a command to the margining test module 132 to perform a margining test. Alternatively, an application may undertake a performance test of the computing device 112, either periodically or in response to a user request, and in response to the performance test generate the trigger to the margining test module 132. For example, an application resident on the computing system 102 may be used to generate such a trigger. In one implementation, such an application may reside outside of the computing system 102 on a server that keeps track of performance characteristics of the computing system 102.

Yet alternatively a heuristics analysis module 128 may be used to generate the trigger to the margining test module 132. For example, the heuristics analysis module 128 keeps track of usage patterns of the devices 110 and analyzes such usage patterns to determine when it is necessary to perform margining tests. As an example, the heuristics analysis module 128 tracks usage of the GPU 114 to determine that it is being used at a rate above a threshold for video gaming applications and as a result in response to such a determination it generates a trigger to the margining test module 132 to perform a margining test on the GPU 114. As another example, the heuristics analysis module 128 tracks an amount of time the devices 110 are in different utilization states, such as a high utilization state (e.g., greater than 80% utilization), a medium utilization state (e.g., between 80% and 30% utilization), and a low utilization state (e.g., below 30% utilization). In this example, the heuristics analysis module 128 may trigger a margining test in accordance with a particular utilization state exceeding a threshold amount of time. Alternatively, or additionally, the heuristics analysis module 128 may assign a weight to each utilization state and trigger a margining test when a weighted combination of the utilization states meets a particular criterion. In one implementation, each of the devices 110 may have different threshold utilization triggering a margining test.

In one implementation a community learning module 130 analyzes device performance data from a large number of devices that are similar to the computing system 102 or that use devices similar to the devices 110 to generate trigger to the margining test module 132. For example, if analysis of a large number of devices using a dual core device similar to the one in the computing system 102 indicates that the performance of such a dual core device has declined below a certain threshold, the community learning module 130 may generate a trigger to the margining test module 132 to perform a margining test on a dual core device of the devices 110. Furthermore, such community learning module 130 may also be used to generate or replenish device characteristics data of the device characteristics data store 122.

In one implementation, the output of the heuristics module 126 is also used by the operating voltage determination module 140 to determine the operating voltage of the devices 110 based on the inputs from the device characteristics data store 122 and the margining test module 132. For example, if the heuristics module 126 determines that one of the devices 110 is used extensively, it may indicate the operating voltage determination module 140 to use the current performance curve output from the margining test module 132 to set the operating voltage for one or more of the devices 110.

Upon determination of the operating voltages of the devices 110, the operating voltage determination module 140 communicates with a battery 160 to set the operating voltages of the devices 110.

Figure 2:
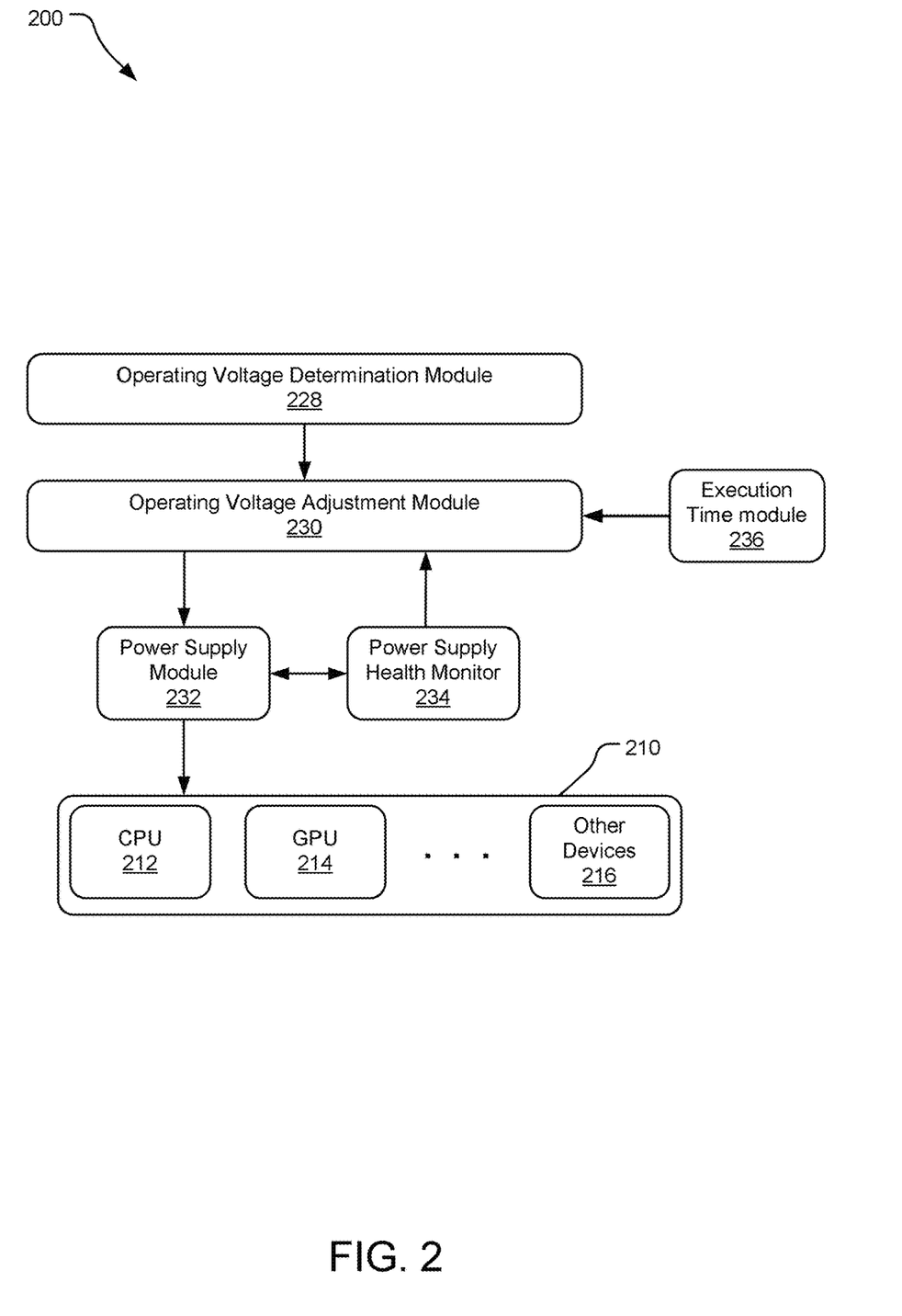
FIG. 2 illustrates an alternative example system wherein the operating voltage of a device is dynamically adjusted as disclosed herein.

FIG. 2 illustrates an implementation of a device 200 configured to dynamically adjust operating voltage of a device. Specifically, the device 200 may be configured for a device such as a laptop, a mobile device, and a tablet to adjust operating voltage levels of one or more of devices 210. The operating voltage adjustment module 200 includes an operating voltage determination module 228 to determine operating voltage of one or the devices 110 based on outputs from a margining test module (such as the margining test module 132 of FIG. 1) and a device characteristics data store (such as the device characteristics data store 122 of FIG. 1). The devices 210 may be one of a CPU 212, a GPU 214, or other devices 216.

The output of the operating voltage determination module 228 is input to an operating voltage adjustment module 230. The operating voltage adjustment module 230 also receives health data from a power supply health monitor 234 regarding health of a power supply module 232. For example, such health data may include current discharge rate of a battery of power supply module 232 and the age of the battery. In one implementation, the power supply health monitor 234 may receive information about health of the battery, its discharge rate, or any potential crash of the battery from a battery charger. For example, the battery charger may indicate that it takes longer to charge the battery, thus flagging some potential change or decline in the chemistry of the battery.

Furthermore, the operating voltage adjustment module 230 also receives input from an execution time module 236 that provides information about the current time that may be used to determine the age of the battery as well as the time in the lifecycle of the devices 110. In one implementation, the execution time module 236 monitors both the actual life of the devices 110 since their manufacture and the operational life of the devices 100. For example, the operational life of the devices 110 provides the actual number of clocks for which the devices 110 have been operational.

The operating voltage adjustment module 230 adjusts the operating voltage as input from the operating voltage determination module 228 in view of the battery health data and the execution time to adjust the operating voltage of the devices. The output from the operating voltage adjustment module 230 is input to the power supply module 232, which supplies power to the devices 210.

Figure 3:
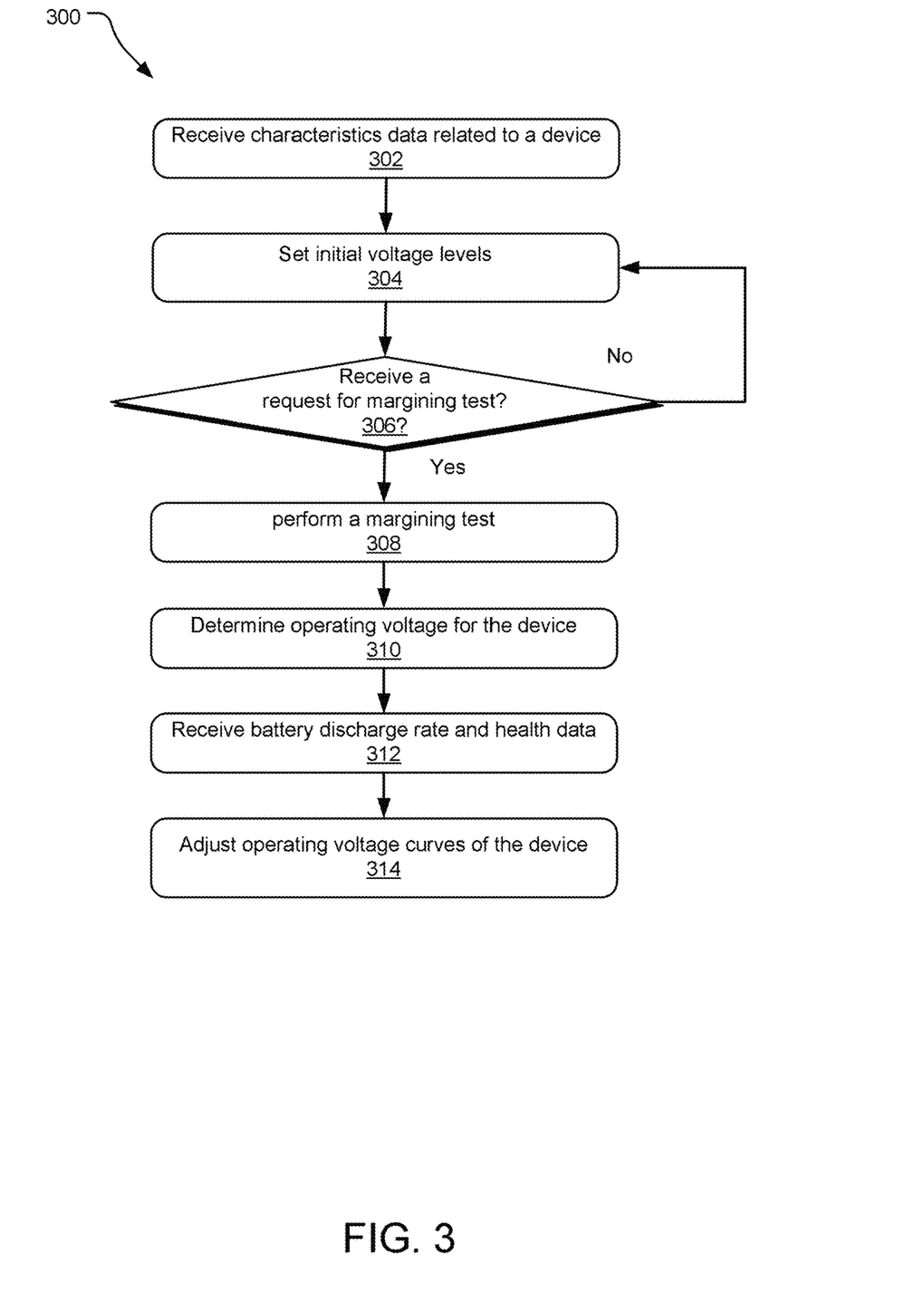
FIG. 3 illustrates example operations of the system disclosed herein for dynamically adjusting operating voltage of a device.

FIG. 3 illustrates example operations 300 of the system disclosed herein for dynamically adjusting operating voltage of a device. Specifically, an operation 302 receives device characteristics data related to a device. In one implementation, such device characteristics data includes data regarding suggested operating voltages for the devices for achieving various operating speeds. An operation 304 sets initial operating voltage levels of the devices based on the device characteristics data. Thus, if a device needs to achieve operating speed of 7 GHz and the device characteristics data suggests the operating voltage required to achieve such speed to be 4.5 v, the operation 304 may set the operating voltage of the devices to be at 4.5 v.

Subsequently, a determining operation 306 may determine if a request has been received to perform a margining test on a device. If so, an operation 308 performs a margining test to generate a current performance curve of the device providing performing voltages required to achieve required operating speed for the device. Based on the performance curve, an operation 310 determines an operating voltage for the device. Subsequently, an operation 312 receives battery discharge rate and other battery health data. For example, a power supply unit (PSU) including the battery may provide such battery health data. An operation 314 adjusts the operating voltage of the devices in view of the battery health data.

Figure 4:
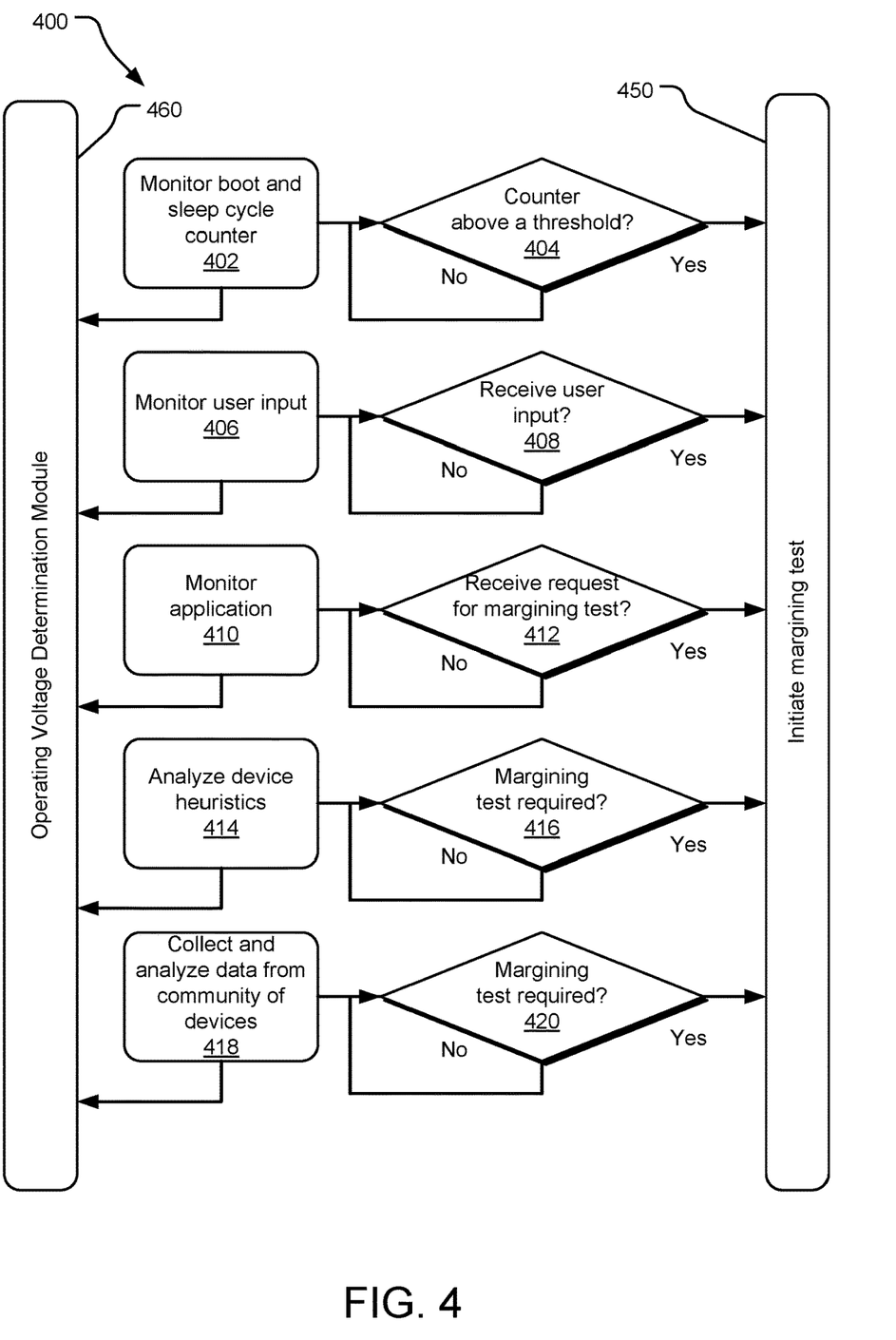
FIG. 4 illustrates alternative example operations of the system disclosed herein for dynamically adjusting operating voltage of a device.

FIG. 4 illustrates alternative example operations 400 of the system disclosed herein for dynamically adjusting operating voltage of a device. Specifically, the operations 400 illustrate various operations for triggering a margining test module to initiate a margining test on a device. An operation 402 monitors a counter that keeps track of boot and sleep cycles of a device. An operation 404 evaluates the output of operation 402 to determine if the count value is above a threshold and if so, it generates a trigger signal to the margining test module. If such a trigger is generated, an operation 450 initiates a margining test.

In one implementation, an operation 406 monitors user inputs to see if a user has requested a margining test. An operation 408 evaluates the user input to generate a trigger to the margining test module. Similarly, an operation module 410 monitors inputs form one or more applications to see if such an application has requested a margining test. An operation 408 evaluates the input from such an application to generate a trigger to the margining test module. In an alternative implementation, an operation 414 analyzes device heuristics including the amount of past usage and the type of past usage. The operation 414 may generate an output in response to such an analysis and an operation 416 analyzes the output from the operation 414 to generate a trigger to the margining test module.

In another implantation, an operation 418 collects and analyzes operational data from a large number of other devices similar to one or more devices of a current device. Such analysis may include average time when the performance of such other devices deteriorates and average useful life expectancy of such devices. The operation 418 generates an output that is evaluated by an operation 420 to generate a trigger to the margining test module.

In an alternative implementation, each of the operations 402-418 provides its output to an operating voltage determination module 460 that determines the operating voltage of the devices based on the input received from these operations. For example, the operating voltage determination module 460 may evaluate a boot and sleep cycle output from the operation 402 and adjust the operating voltage of devices based on the value of such boot and sleep cycle counter. Similarly, the operating voltage determination module 460 may receive the output from the operation 414 and based on the heuristics value received from the operation 414 it adjusts the operating voltage of devices.

Figure 5:
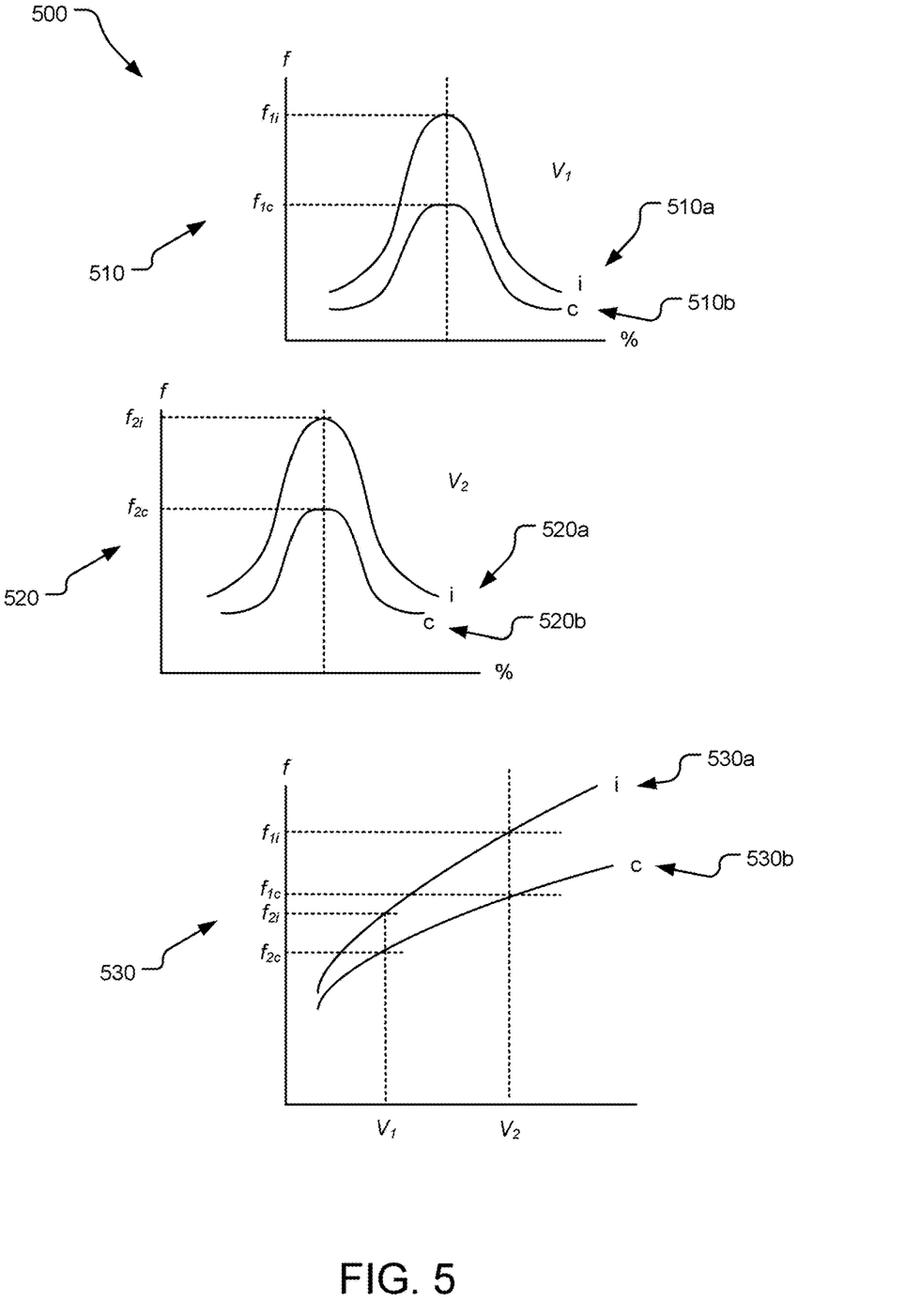
FIG. 5 illustrates example curves illustrating relation between operating voltages and operating speed of a device.

FIG. 5 illustrates various curves 500 illustrating relations between operating voltages and operating speed of a device, such as one of the devices 110 disclosed in FIG. 1. Specifically, performance curves 510 illustrate two curves illustrating operating speeds $f$ of a device at operating voltage $V_1$. Here 510a represents initial curve that may be obtained from the device characteristics data store 122 illustrated in FIG. 1. For example, the manufacturer of the device may provide such information, or it may be based on collection of information from a community of devices. On the other hand, 510b represents current curve generated by the margining test module 132 illustrated in FIG. 1. As illustrated, the mean operating speed declines from $f_1i$ to $f_{2i}$. Similarly, performance curves 520 illustrate two curves illustrating operating speeds $f$ of a device at operating voltage $V_2$. Here 520a represents initial curve that may be obtained from the device characteristics data store 122 illustrated in FIGS. 1 and 520b represents current curve generated by the margining test module 132 illustrated in FIG. 1.

The change in the relationships between operating voltage and operating speed at different stages is further illustrated by performance curves 530. Specifically, 530a illustrates such relation between operating voltage and operating speed at initial stage of the device and it may be obtained from the device characteristics data store 122 illustrated in FIG. 1. On the other hand, curve 530b illustrates the current relation between operating voltage and operating speed of the device and it may be generated by the margining test module 132 illustrated in FIG. 1. As illustrated, for each operating voltage, the mean operating speed obtained by the device in its current stage is lower than at the initial stage of the device.

In one implementation, the curves 530a and 530b may be used to generate a differential curve that represents change in the operating speed at various operating voltage levels. Alternatively, such differential curve may provide additional operating voltage necessary to achieve each of various operating speeds for the device. The performance curves 510a, 520a, and 530a may be used to set the initial operating voltage of devices when they are initially installed in computing devices. The performance curves 510b, 520b, and 530b may be used to set the current operating voltage of devices after margining tests.

Figure 6:
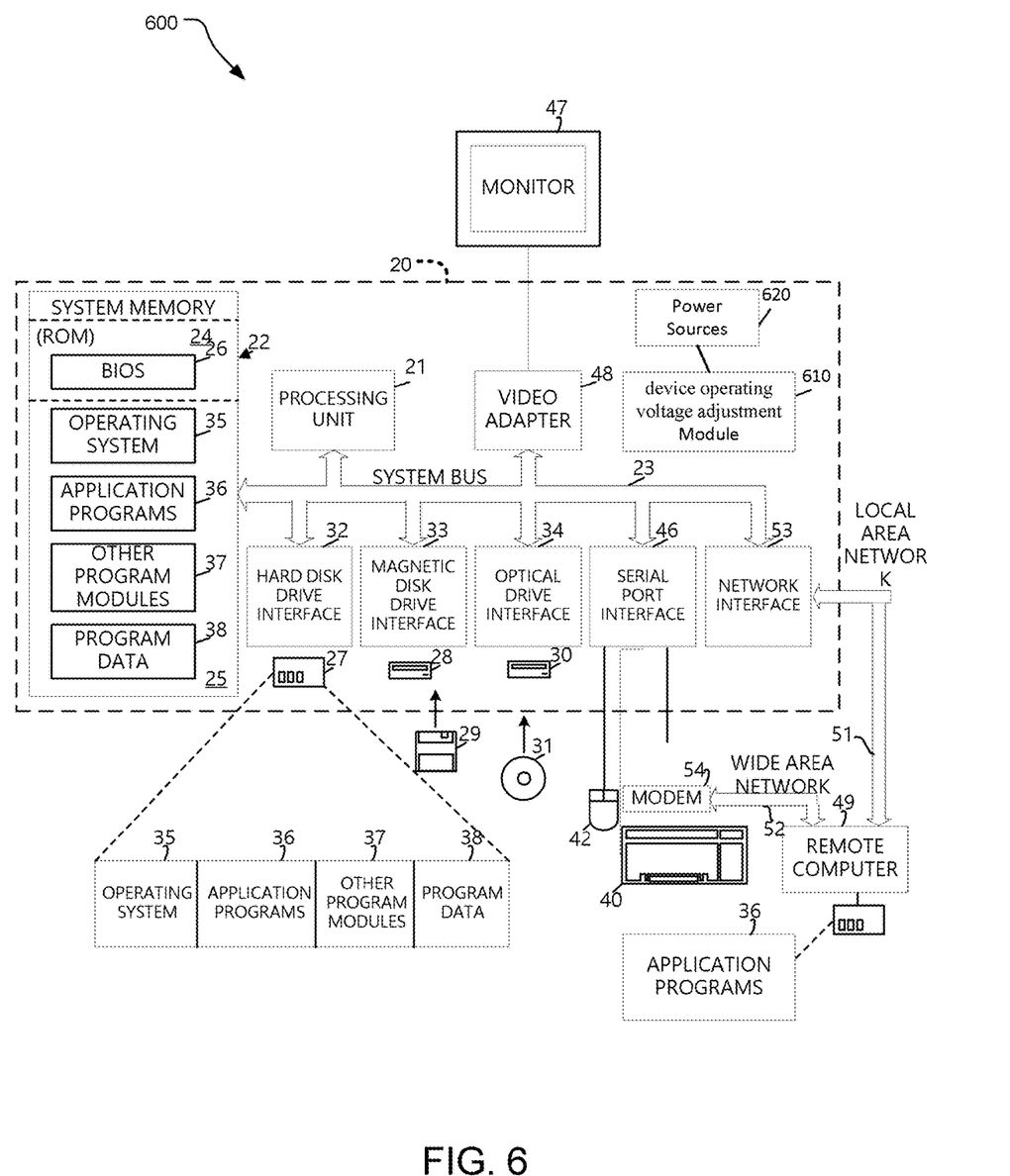
FIG. 6 illustrates an example computing system that includes the system for dynamically adjusting operating voltage of a device.

FIG. 6 illustrates an example system 600 that may be useful in implementing the system disclosed herein for dynamically adjusting operating voltage of a processor. The example hardware and operating environment of FIG. 6 for implementing the described technology includes a computing device, such as a general-purpose computing device in the form of a computer 20, a mobile telephone, a personal data assistant (PDA), a tablet, smart watch, gaming remote, or other type of computing device. In the implementation of FIG. 6, for example, the computer 20 includes a processing unit 21, a system memory 22, and a system bus 23 that operatively couples various system components, including the system memory 22 to the processing unit 21. There may be only one or there may be more than one processing units 21, such that the processor of a computer 20 comprises a single central-processing unit (CPU), or a plurality of processing units, commonly referred to as a parallel processing environment. The computer 20 may be a conventional computer, a distributed computer, or any other type of computer; the implementations are not so limited.

In the example implementation of the computing system 600, the computer 20 also includes a processor operating voltage adjustment module 610, such as the processor operating voltage adjustment system disclosed herein. The processor operating voltage adjustment module 610 may communicate with power sources 620 to control the operating voltage provided by the power sources 620.

The system bus 23 may be any of several types of bus structures, including a memory bus or memory controller, a peripheral bus, a switched fabric, point-to-point connections, and a local bus using any of a variety of bus architectures. The system memory 22 may also be referred to as simply the memory and includes read-only memory (ROM) 24 and random-access memory (RAM) 25. A basic input/output system (BIOS) 26, contains the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM, DVD, or other optical media.

The computer 20 may be used to implement a device operating voltage adjustment system disclosed herein. In one implementation, a frequency unwrapping module, including instructions to unwrap frequencies based on the sampled reflected modulations signals, may be stored in memory of the computer 20, such as the read-only memory (ROM) 24 and random-access memory (RAM) 25.

Furthermore, instructions stored on the memory of the computer 20 may also be used to implement one or more operations of FIGS. 3 and 4. The memory of the computer 20 may also store one or more instructions to implement the device operating voltage adjustment system disclosed herein.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated tangible computer-readable media provide non-volatile storage of computer-readable instructions, data structures, program modules and other data for the computer 20. It should be appreciated by those skilled in the art that any type of tangible computer-readable media may be used in the example operating environment.

A number of program modules may be stored on the hard disk, magnetic disk 29, optical disk 31, ROM 24, or RAM 25, including an operating system 35, one or more application programs 36, other program modules 37, and program data 38. A user may generate reminders on the personal computer 20 through input devices such as a keyboard 40 and pointing device 42. Other input devices (not shown) may include a microphone (e.g., for voice input), a camera (e.g., for a natural user interface (NUI)), a joystick, a game pad, a satellite dish, a scanner, or the like. These and other input devices are often connected to the processing unit 21 through a serial port interface 46 that is coupled to the system bus 23, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. These logical connections are achieved by a communication device coupled to or a part of the computer 20; the implementations are not limited to a particular type of communications device. The remote computer 49 may be another computer, a server, a router, a network PC, a client, a peer device or other common network node, and typically includes many or all of the elements described above relative to the computer 20. The logical connections depicted in FIG. 6 include a local-area network (LAN) 51 and a wide-area network (WAN) 52. Such networking environments are commonplace in office networks, enterprise-wide computer networks, intranets and the Internet, which are all types of networks.

When used in a LAN-networking environment, the computer 20 is connected to the local area network 51 through a network interface or adapter 53, which is one type of communications device. When used in a WAN-networking environment, the computer 20 typically includes a modem 54, a network adapter, a type of communications device, or any other type of communications device for establishing communications over the wide area network 52. The modem 54, which may be internal or external, is connected to the system bus 23 via the serial port interface 46. In a networked environment, program engines depicted relative to the personal computer 20, or portions thereof, may be stored in the remote memory storage device. It is appreciated that the network connections shown are example and other means of communications devices for establishing a communications link between the computers may be used.

In an example implementation, software or firmware instructions for the device operating voltage adjustment module 610 may be stored in system memory 22 and/or storage devices 29 or 31 and processed by the processing unit 21. Instructions and data to implement the device operating voltage adjustment module 610 may be stored in system memory 22 and/or storage devices 29 or 31 as persistent data-stores.

In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments of the device operating voltage adjustment system disclosed herein may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

The device operating voltage adjustment system disclosed herein may include a variety of tangible computer-readable storage media and intangible computer-readable communication signals. Tangible computer-readable storage can be embodied by any available media that can be accessed by the device operating voltage adjustment system disclosed herein and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the device operating voltage adjustment system disclosed herein. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals moving through wired media such as a wired network or direct-wired connection, and signals moving through wireless media such as acoustic, RF, infrared and other wireless media.

The device operating voltage adjustment system disclosed herein provides a technical solution to a technical problem of managing battery resources by operating devices at operating voltage levels in view of device characteristics data and output from a margining test module. The solution disclosed herein and recited in the claims solves a technical problem in computing system. Moreover, various implementations disclosed herein and recited in the claims solves the technical problem necessitated by ageing of technical components, such as devices, sensors, LCD, and other silicon-based components used in computing and mobile devices by providing a technical solution using technical components including a margining test module. Furthermore, the device operating voltage adjustment system disclosed herein also adjusts operating voltages of the devices based on changes in battery performance over the life of the battery, including changes in the battery chemistry and its discharge rates. Thus, the device operating voltage adjustment system disclosed herein provides a technical solution of adjusting operating voltages of the devices based on changes in battery performance over the life of the battery to address the technical problem of varying battery discharge rates.

Implementations disclosed herein provide a system including a device characteristics data store 122 configured to store device characteristics data for a device 110, a margining test module 132 configured to generate a performance curve 530*b* providing the device's current performance speeds at various operating voltages, an operating voltage determination module 140 configured to determine an operating voltage for the device based on the device characteristics data and the performance curve, and a battery module configured to change the operating voltage of the device based on an output of the operating voltage determination module. In one implementation, the performance curve is a differential performance curve characterizing variation of the device's current performance speeds at various operating voltages from expected performance speeds at the various operating voltages.

In an alternative implementation, the margining test module 132 is further configured to receive an output from boot and sleep cycle counter 124 and to perform the margining test for the device 110 in response to the output from a boot and sleep cycle counter. In another alternative implementation, the margining test module 132 is further configured to perform the margining test for the device in response to the input from the user 126. In another implementation, the system further includes a heuristics analysis module 128 configured to analyze heuristics about usage of the device for a predetermined time to generate an input to the operating voltage determination module 140. In one implementation, the operating voltage determination module 140 is configured to determine an operating voltage for the device in response to an output from the heuristics analysis module 128.

In an alternative implementation, the system also includes a power supply health monitor 234 configured to monitor battery discharge levels of a battery and an operating voltage adjustment module 230 configured to adjust the operating voltage generated by the operating voltage determination module 228 based on the battery discharge levels.

A method for dynamically adjusting operating voltage of a device includes receiving 302 device characteristics data related to a device, performing 308 a margining test for the device to generate a performance curve characterizing variation of the device's current performance speeds at various operating voltages from expected performance speeds at the various operating voltages, determining 310 an operating voltage for the device based on the device characteristics data and the performance curve, and determining 310 the operating of the device based on the determined operating voltage. An implementation of the method also includes receiving 404 an output from boot and sleep cycle counter and performing the margining test for the device in response to the output from a boot and sleep cycle counter. In another alternative implementation, the method also includes receiving 408 an input from a user and performing the margining test for the device in response to the input from the user.

In one implementation, the method for dynamically adjusting operating voltage of a device further includes receiving 412 an input from an application running on a device using the device and performing the margining test for the device in response to the input from the application. In another implementation, the method also includes analyzing 414 heuristics about usage of the device for a predetermined time to generate a margining test request and performing the margining test for the device in response to receiving the margining test request. In yet another implementation, the method also includes receiving 314 an indication of a battery discharge rate and adjusting 314 the operating voltage for the device based on the battery discharge rate. Alternatively, the method includes using the device characteristics data to determine 304 the initial operating voltage of the device.

A system for dynamically adjusting operating voltage of a device includes a memory, on or more device units, and a device operating voltage adjustment system stored in the memory and executable by the one or more device units wherein the device operating voltage adjustment system encoding computer-executable instructions on the memory for executing on the one or more device units a computer process including receiving 302 device characteristics data related to a device, performing 308 a margining test for the device to generate a performance curve characterizing variation of the device's current performance speeds at various operating voltages from expected performance speeds at the various operating voltages, determining 310 an operating voltage for the device based on the device characteristics data and the performance curve, and adjusting 310 the operating of the device based on the determined operating voltage.

In an alternative implementation, the computer process also includes receiving 404 an output from boot and sleep cycle counter and performing the margining test for the device in response to the output from a boot and sleep cycle counter. In another implementation, the computer process also includes performing the margining test for the device in response to an input 406 from the user. In another implementation, the computer process includes performing the margining test for the device in response to the input from an application 410 in the computing environment.

In one implementation of the system for dynamically adjusting operating voltage of a device, the computer process also includes analyzing 414 heuristics about usage of the device for a predetermined time to generate a margining test request and performing the margining test for the device in response to receiving the margining test request. Alternatively, the computer process includes receiving 312 an indication of a battery discharge rate and adjusting 314 the operating voltage for the device based on the battery discharge rate.

The implementations described herein are implemented as logical steps in one or more computer systems. The logical operations may be implemented (1) as a sequence of device-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A system, comprising:
   a device characteristics data store configured to store device characteristics data for a device;
   a heuristics analysis module executable by a processor and configured to analyze heuristics about usage of the device for a predetermined time to generate an output representing a trigger to initiate a margining test;
   a margining test module executable by a processor and configured to generate, responsive to the generated output, a performance curve providing the device's current performance speeds at various operating voltages; and
   an operating voltage determination module executable by a processor and configured to determine an operating voltage for the device based on the device characteristics data and the performance curve and to change an operating voltage of the device based on the performance curve.

2. The system of claim 1, wherein the performance curve is a differential performance curve characterizing variation of the device's current performance speeds at various operating voltages from expected performance speeds at the various operating voltages.

3. The system of claim 1, wherein the margining test module is further configured to receive an output from a boot and sleep cycle counter and to perform the margining test for the device in response to the output from a boot and sleep cycle counter.

4. The system of claim 3, wherein the margining test module is further configured to perform the margining test for the device in response to the input from a user.

5. The system of claim 1, wherein operating voltage determination module is configured to determine an operating voltage for the system device in response to an output from the heuristics analysis module.

6. The system of claim 1, further comprising:
   a power supply health monitor configured to monitor battery discharge levels of a battery; and
   an operating voltage adjustment module executable by a processor and configured to adjust the operating voltage generated by the operating voltage determination module based on the battery discharge levels.

7. A method, comprising:
   receiving device characteristics data related to a device;
   analyzing heuristics about usage of the device for a predetermined time to generate a margining test request;
   performing a margining test, responsive to the generated margining test request, for the device to generate a performance curve characterizing variation of the device's current performance speeds at various operating voltages from expected performance speeds at the various operating voltages;
   determining an operating voltage for the device based on the device characteristics data and the performance curve; and
   adjusting the operating of the device based on the determined operating voltage.

8. The method of claim 7, further comprising:
   receiving an output from boot and sleep cycle counter; and
   performing the margining test for the device in response to the output from a boot and sleep cycle counter.

9. The method of claim 7, further comprising:
   receiving an input from a user; and
   performing the margining test for the device in response to the input from the user.

10. The method of claim 7, further comprising:
    receiving an input from an application running on a device using the device; and
    performing the margining test for the device in response to the input from the application.

11. The method of claim 7, further comprising:
    receiving an indication of a battery discharge rate; and
    adjusting the operating voltage for the device based on the battery discharge rate.

12. The method of claim 7, further comprising using the device characteristics data to determine the initial operating voltage of the device.

13. In a computing environment, a system comprising:
    memory;
    one or more device units; and
    a device operating voltage adjustment system stored in the memory and executable by the one or more device units, the device operating voltage adjustment system encoding computer-executable instructions on the memory for executing on the one or more device units a computer process, the computer process comprising:
    receiving device characteristics data related to a device;
    analyzing heuristics about usage of the device for a predetermined time to generate a margining test request;
    performing a margining test, responsive to the generated margining test request, for the device to generate a performance curve providing the device's current performance speeds at various operating voltages;
    determining an operating voltage for the device based on the device characteristics data and the performance curve; and
    adjusting the operating of the device based on the determined operating voltage.

14. The system of claim 13, wherein the computer process further comprising:
    receiving an output from boot and sleep cycle counter; and
    performing the margining test for the device in response to the output from a boot and sleep cycle counter.

15. The system of claim 13, wherein the computer process further comprising performing the margining test for the device in response to an input from a user.

16. The system of claim 13, the computer process further comprising performing the margining test for the device in response to an input from an application in the computing environment.

17. The system of claim 13, the computer process further comprising:
- receiving an indication of a battery discharge rate; and
- adjusting the operating voltage for the device based on the battery discharge rate.

* * * * *